(12) United States Patent
Karagoez et al.

(10) Patent No.: US 12,041,741 B2
(45) Date of Patent: Jul. 16, 2024

(54) HOUSING HAVING A PRESSURE COMPENSATION DEVICE

(71) Applicant: Knorr-Bremse Systeme Fuer Nutzfahrzeuge GmbH, Munich (DE)

(72) Inventors: Hasan-Oezkan Karagoez, Pforzheim (DE); Friedbert Roether, Cleebronn (DE); Thilo Franzke, Bad Staffelstein (DE)

(73) Assignee: KNORR-BREMSE SYSTEME FUER NUTZFAHRZEUGE GMBH, Munich (DE)

( * ) Notice: Subject to any disclaimer, the term of this patent is extended or adjusted under 35 U.S.C. 154(b) by 232 days.

(21) Appl. No.: 17/789,568

(22) PCT Filed: Jan. 8, 2021

(86) PCT No.: PCT/EP2021/050232
§ 371 (c)(1),
(2) Date: Jun. 28, 2022

(87) PCT Pub. No.: WO2021/148256
PCT Pub. Date: Jul. 29, 2021

(65) Prior Publication Data
US 2023/0041598 A1    Feb. 9, 2023

(30) Foreign Application Priority Data

Jan. 20, 2020 (DE) ................... 10 2020 101 213.6

(51) Int. Cl.
*H05K 5/02* (2006.01)
*H05K 5/06* (2006.01)
(Continued)

(52) U.S. Cl.
CPC ........... *H05K 5/068* (2013.01); *H05K 5/0213* (2013.01); *H05K 5/0215* (2022.08); *F16K 17/02* (2013.01);
(Continued)

(58) Field of Classification Search
CPC .... H05K 5/068; H05K 5/0215; H05K 5/0213; H05K 5/0216; F16K 31/126;
(Continued)

(56) References Cited

U.S. PATENT DOCUMENTS

| 4,756,982 A | 7/1988 | McCartney, Jr. et al. |
| 2001/0003184 A1 | 6/2001 | Ching et al. |

(Continued)

FOREIGN PATENT DOCUMENTS

| CN | 103260710 A | 8/2013 |
| CN | 106574722 A | 4/2017 |

(Continued)

OTHER PUBLICATIONS

International Search Report for PCT/EP2021/050232 Issued Apr. 13, 2021.

*Primary Examiner* — Steven T Sawyer
(74) *Attorney, Agent, or Firm* — NORTON ROSE FULBRIGHT US LLP; Gerard A. Messina

(57) ABSTRACT

A housing having an interior, including: a) a pressure-compensation-device (PCD), for compensating a pressure in the interior as to surroundings of the housing, the interior being connected with the PCD, and an overpressure-valve (OV) with a lip-sealing-element (LSE) with a main-part and a flexible-sealing-lip (FSL), protruding radially-outwardly from an outer-circumference of the main-part and interacts with a sealing-surface (SS); b) an annular-channel (AC), between the main-part and SS, the FSL being in sealed contact with the SS with elastic-pretensioning in a sealing- (Continued)

position and sealingly closes the AC to prevent a flow-conducting connection between the interior/surroundings, and is lifted away from the SS in an open-position and opens the AC to provide a flow-conducting connection between the interior/surroundings; c) the FSL position between the sealing/open positions is controlled as a function of a pressure-difference between the pressure in the interior/surroundings, d) the main-part of the LSE has an inner-gas-through-channel (IGTC) connecting the interior/surroundings, e) the PCD includes a gas-permeable-membrane covering the IGTC, f) the OV and the membrane have a parallel connection, a pressure-difference between the interior/surroundings acting on the OV/membrane, having: g) the main-part and the FSL of the LSE are a single-piece elastomer, h) a borehole in a housing-wall, connectable with the interior/surroundings, i) the LSE is held in the borehole, the sealing-surface interacting with the FSL, and is formed by the radially-inner-circumferential-surface of the borehole.

18 Claims, 3 Drawing Sheets

(51) Int. Cl.
*F16K 17/02* (2006.01)
*F16K 31/126* (2006.01)
*H01M 50/308* (2021.01)
*H01M 50/325* (2021.01)

(52) U.S. Cl.
CPC ......... *F16K 31/126* (2013.01); *H01M 50/308* (2021.01); *H01M 50/325* (2021.01)

(58) Field of Classification Search
CPC ........ F16K 15/148; F16K 17/02; F16K 24/00; H01M 50/325; H01M 50/308; B01D 46/543; B01D 2239/1258; B32B 2307/724
See application file for complete search history.

(56) References Cited

U.S. PATENT DOCUMENTS

| | | |
|---|---|---|
| 2007/0125231 A1 | 6/2007 | Thomas et al. |
| 2018/0219200 A1* | 8/2018 | Albukrek ............ H01M 50/333 |
| 2018/0292020 A1* | 10/2018 | Kleinke ................ F16K 31/126 |
| 2019/0025762 A1* | 1/2019 | Podvin ................. G04B 37/088 |
| 2020/0340592 A1 | 10/2020 | Nakayama et al. |
| 2021/0320375 A1* | 10/2021 | Zbiral ................. H01M 50/308 |
| 2021/0396323 A1* | 12/2021 | Nakayama .............. F16K 24/04 |
| 2021/0396324 A1* | 12/2021 | Nakayama ........... H05K 5/0213 |

FOREIGN PATENT DOCUMENTS

| | | |
|---|---|---|
| CN | 107003200 A | 8/2017 |
| CN | 207266471 U | 4/2018 |
| DE | 102008008173 A1 | 8/2009 |
| DE | 202017105680 U1 | 12/2017 |
| DE | 102017123078 A1 | 4/2019 |
| EP | 3385584 B1 | 9/2019 |
| WO | 2016180972 A1 | 11/2016 |

* cited by examiner

HOUSING HAVING A PRESSURE COMPENSATION DEVICE

FIELD OF THE INVENTION

The invention relates to a housing having a pressure compensation device as described herein.

BACKGROUND INFORMATION

In order to avoid problems caused by penetrating dirt, temperature fluctuations and condensation, housings which receive, in particular, corrosion-sensitive electronics and electrics often have a pressure compensation device.

A generic housing having a pressure compensation device is discussed in EP 3 385 584 B1. Here the pressure compensation device contains a lattice-like cage with a gas through-opening which connects the inner face and the outer face of the pressure compensation device in a flow-conducting manner, as required, and which is covered by a gas-permeable membrane which is configured as a non-woven composite part and comprises at least one non-woven layer. The membrane is assigned an overpressure valve which is configured as a burst protection device in a parallel connection in terms of functional technology, wherein the overpressure valve comprises a circular screen, the inner edge thereof being clamped between two parts of an inner half of the cage and the outer edge thereof sealingly interacting with a sealing surface on the outer edge of the inner half. The gas through-opening is configured centrally in the inner half of the cage, wherein the inner half of the cage is enclosed by an outer half of the cage. As a result, a complex construction of the pressure compensation device is produced, with a relatively high number of components to be assembled.

SUMMARY OF THE INVENTION

Accordingly, it is an object of the invention to provide a housing having a pressure compensation device which may be constructed in a simpler manner and which may be manufactured more cost-effectively.

This object may be achieved by a pressure compensation device as described herein.

The invention is based on a housing having a pressure compensation device for compensating a pressure in an interior of the housing in relation to the surroundings of the housing, said interior being in connection with the pressure compensation device, having at least the following features:
a) the pressure compensation device comprises at least one overpressure valve with at least one lip sealing element with a main part and at least one flexible sealing lip which protrudes radially outwardly from an outer circumference of the main part and which interacts with a sealing surface,
b) an annular channel is configured between the main part and the sealing surface, wherein the at least one flexible sealing lip is in sealed contact with the sealing surface with elastic pretensioning in a sealing position and thereby sealingly closes the annular channel to prevent a flow-conducting connection between the interior and the surroundings, and is lifted away from the sealing surface in an open position and thereby opens the annular channel to provide a flow-conducting connection between the interior and the surroundings,
c) the position of the at least one sealing lip between the sealing position and the open position is controlled as a function of a pressure difference between the pressure in the interior of the housing and the surroundings of the housing,
d) the main part of the lip sealing element has an inner gas through-channel which connects the interior to the surroundings, as required,
e) the pressure compensation device comprises at least one gas-permeable membrane which covers the inner gas through-channel of the main part,
f) the overpressure valve and the at least one membrane are arranged in a parallel connection in terms of functional technology, such that a pressure difference between the interior of the housing and the surroundings of the housing acts both on the overpressure valve and on the at least one membrane.

That the position of the at least one sealing lip between the sealing position and the open position is controlled as a function of a pressure difference between the pressure in the interior of the housing and the surroundings of the housing means, in particular, that
i) when a difference between the internal pressure prevailing in the interior and the external pressure prevailing in the surroundings is below a pressure threshold value, the at least one sealing lip adopts the sealing position, but
ii) when the difference between the internal pressure prevailing in the interior and the external pressure prevailing in the surroundings reaches or has exceeded the pressure threshold value, the at least one sealing lip adopts the open position.

The pressure threshold value may be, for example, a value within a range such as for example 0.4 bar to 1.2 bar.

A "housing" within the meaning of the invention is not to be understood to mean a separate housing of the pressure compensation device, as is formed for example by the lattice-like cage of EP 3 385 584 B1. Here the lattice-like cage has to be arranged first with the pressure compensation device on or in a housing. The pressure compensation device according to the invention accordingly does not have an individual or separate housing since the borehole of the housing wall of the housing which is provided, in particular, to house an electrical, electronic or electro-pneumatic device, already represents an outer limit for the pressure compensation device.

The overpressure valve forms, in particular, a burst protection device for the at least one membrane, such that in the event of a high internal pressure suddenly occurring in the interior of the housing, a rapid pressure compensation is carried out into the surroundings, primarily by the overpressure valve, and a bursting of the at least one membrane is avoided thereby. The at least one gas-permeable membrane accordingly permits a slower pressure compensation. The at least one membrane is thus gas-permeable in both directions but is semi-permeable relative to liquids, such that liquids may pass through the at least one membrane only in one direction, namely from the interior in the direction of the surroundings, but not in the reverse direction. This advantageously prevents a penetration of liquid from the surroundings into the interior of the housing through the at least one membrane.

The housing according to the invention thus has the following further features:
g) the main part and the at least one flexible sealing lip of the lip sealing element are configured in a single piece from an elastomer material,
h) the housing has a borehole in a housing wall which is in connection or may be brought into connection, on the one hand, with the interior and, on the other hand, with the surroundings of the housing, i) the lip sealing element is directly held in the borehole in the housing wall and the sealing surface, with which the at least one flexible sealing lip interacts, is formed by the radially inner circumferential surface of the borehole in the housing wall.

The borehole in the housing wall of the housing, the at least one lip sealing element, the inner gas through-channel of the main part and the at least one membrane may have a circular cross section. Moreover, these elements may also be arranged coaxially.

Moreover, the external diameter of the sealing lip may be slightly larger than the internal diameter of the borehole, such that a certain contact force is produced between the sealing lip and the sealing surface in the form of the radially inner circumferential surface of the borehole in the sealing position.

In contrast to EP 3 385 584 B1, therefore, firstly a lattice-like cage, which bears the components of the pressure compensation device, is no longer required.

Instead, the lip sealing element is directly held in the borehole in the housing wall of the housing, which in particular houses an electrical, electronic or electro-pneumatic device. Moreover, the sealing surface, with which the at least one flexible sealing lip interacts, is then formed by the radially inner circumferential surface of the borehole in the housing wall.

In contrast to EP 3 385 584 B1, therefore, secondly the overpressure valve is no longer configured in multiple parts, but the main part and the at least one flexible sealing lip of the lip sealing element are configured in a single piece from an elastomer material. Configured "in a single piece" means that the main part and the at least one flexible sealing lip of the lip sealing element are produced together in one manufacturing step.

Overall, a structure having only a few structural elements is produced by the invention, the housing which is already present and which is provided for the pressure compensation using said structure as a direct receiver for the pressure compensation device.

The borehole of the housing may be formed by a stepped borehole, wherein a step of the stepped borehole which separates a larger borehole diameter from a smaller borehole diameter forms an axial stop for the lip sealing element. The larger borehole diameter of the stepped borehole is arranged, in particular, so as to face toward the side of the interior of the housing and to face away from the side of the surroundings. Then the at least one membrane may be held or clamped between the lip sealing element and the step of the stepped borehole.

Alternatively, the borehole of the housing may also be formed by a blind bore, wherein the base of the blind bore forms an axial stop for the lip sealing element and at least one opening is configured in the base of the blind bore, said opening connecting to the surroundings a side of the lip sealing element and of the at least one membrane facing toward the surroundings. In particular, the opening may be arranged eccentrically relative to a central axis of the blind bore. The borehole opening of the blind bore is arranged, in particular, so as to face toward the side of the interior of the housing and to face away from the side of the surroundings. In this case, the at least one membrane may be held or clamped between the lip sealing element and the base of the blind bore.

The lip sealing element may also be fixed in the borehole by a flow-permeable hold-down element. In this case the hold-down element may be formed, for example, by a cover with at least one through-opening. The hold-down element is arranged, in particular, so as to face toward the side of the interior of the housing and to face away from the side of the surroundings. Then the at least one membrane may be held or clamped between the lip sealing element and the hold-down element.

The lip sealing element may also be divided axially into at least two lip sealing element parts, and the at least one membrane is then axially clamped or held between the two lip sealing element parts.

According to a development, the at least one membrane may be already vulcanized into the lip sealing element during the production of the lip sealing element from the elastomer material. In this case, in particular, a radially outer edge of the at least one membrane may be vulcanized into the lip sealing element consisting of the elastomer material.

Moreover, the at least one membrane may be unreleasably, i.e. not releasable without destruction, or releasably connected to the lip sealing element. In particular, the at least one membrane may have a radially outer carrier ring which is unreleasably or releasably connected to the lip sealing element.

For example, the at least one membrane may be connected to the lip sealing element by adhesive bonding.

According to a development, the at least one membrane may consist of at least one membrane layer or may be formed by a composite part consisting of at least one membrane layer and at least one non-woven layer. In this case, the at least one membrane layer may consist, for example, of polytetrafluorethylene (PTFE) or of polyvinylidene fluoride (PVDF).

The at least one flexible sealing lip of the lip sealing element may also be configured over the circumference on the main part, when viewed in the circumferential direction.

The overpressure valve may be configured such that it permits a flow from the interior into the surroundings but prevents a flow from the surroundings into the interior. As a result, with the overpressure valve an entry of moisture and dirt from the surroundings into the interior of the housing is avoided.

This may be implemented, for example, by the at least one flexible sealing lip of the lip sealing element protruding away from the main part at an acute angle in the direction of the surroundings. Then an overpressure on the surroundings side ensures that the sealing lip is pushed more forcibly against the radially inner circumferential surface of the borehole and the sealing action is then increased in this direction.

The housing may be the housing of an electronic or electro-pneumatic device of a vehicle, in particular an electro-pneumatic pressure control module or electro-pneumatic axle modulator of an electro-pneumatic electronically controlled braking device of a vehicle.

Exemplary embodiments of the invention are described in more detail in the following description, with reference to the figures.

DETAILED DESCRIPTION

Figure 1:
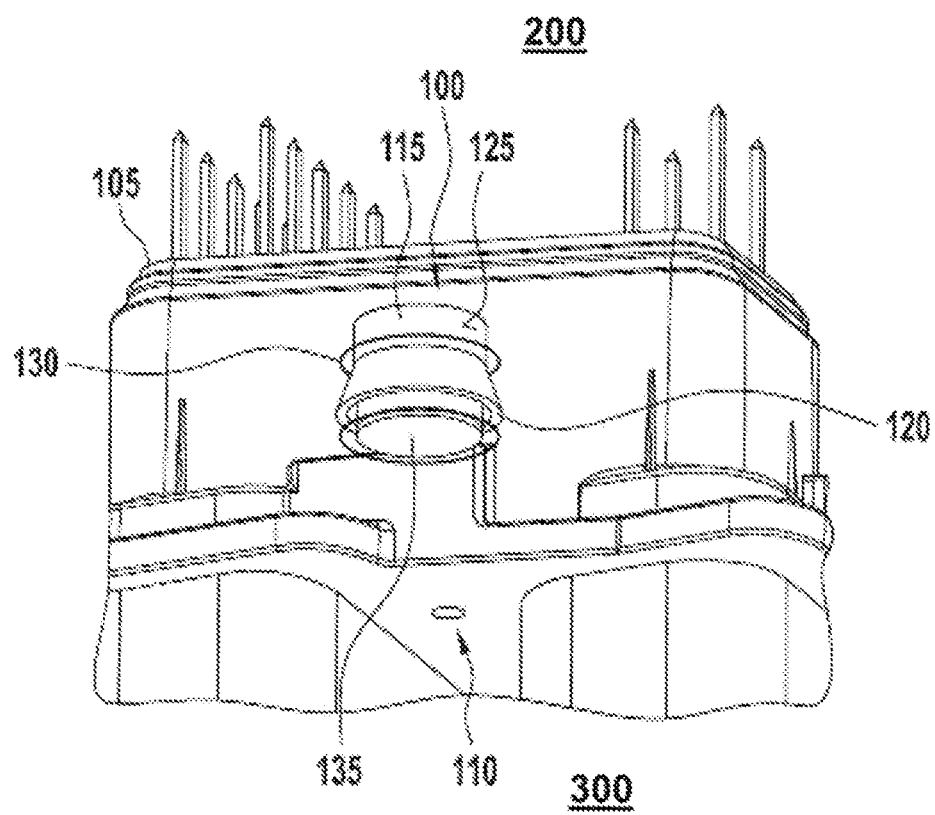
FIG. 1 shows a perspective cut-away view of a housing of an electro-pneumatic pressure control module as an exemplary embodiment of a housing according to the invention.

FIG. 1 shows a perspective cut-away view of a housing 105 of an electro-pneumatic pressure control module of an electro-pneumatic braking device of a vehicle, as an exemplary embodiment of a housing according to the invention.

The housing 105 has a pressure compensation device 100 or a pressure compensation device 100 is integrated in the housing 105, said pressure compensation device serving for pressure compensation between an internal pressure in an interior 200 of the housing 105 connected to the pressure compensation device 100 and an external pressure prevailing in the surroundings 300 of the housing 2015 which generally corresponds to atmospheric pressure.

The pressure compensation device 100 comprises an overpressure valve having a lip sealing element 115 which substantially consists of a main part 125 and in this case, for example, a flexible sealing lip 120 protruding radially outwardly from an outer circumference of the main part 125. The main part 125 and the flexible sealing lip 120 of the lip sealing element 115 are configured in a single piece from an elastomer material.

The flexible sealing lip 120 of the lip sealing element 115 interacts with a sealing surface 140 which is formed by a radially inner circumferential surface of a borehole 205 in a housing wall of the housing 105. This is because the lip sealing element 115 is held directly in the borehole 205 of the housing wall. The borehole 205 is connected, on the one hand, to the interior 200 and, on the other hand, to the surroundings 300 of the housing 105.

An annular channel 130 is configured between the main part 125 and the sealing surface 140 or the radially inner circumferential surface of the borehole 205, wherein the flexible sealing lip 120 is in sealed contact with the sealing surface 140 with elastic pretensioning in a sealing position of the overpressure valve and thereby sealingly closes the annular channel 130 to prevent a flow-conducting connection between the interior 200 and the surroundings 300. In an open position of the overpressure valve, however, the flexible sealing lip 120 is lifted away from the sealing surface 140. Thus the annular channel 130 is opened, to provide a flow-conducting connection between the interior 200 and the surroundings 300.

The external diameter of the sealing lip 120 may be slightly larger than the internal diameter of the borehole 205, such that a certain contact force is produced between the sealing lip 120 and the sealing surface 140 in the form of the radially inner circumferential surface of the borehole 205 in the sealing position. The flexible sealing lip 120 of the lip sealing element 115 may be configured over the circumference on the main part 125, when viewed in the circumferential direction.

The position of the flexible sealing lip 120 between the sealing position and the open position is controlled as a function of the pressure difference between the internal pressure in the interior 200 of the housing 105 and the external pressure prevailing in the surroundings 300 of the housing 105. This means, for example, that when a difference between the internal pressure prevailing in the interior 200 and the external pressure prevailing in the surroundings 300 (atmospheric pressure) is below a pressure threshold value, then the flexible sealing lip 120 adopts the sealing position. If, however, a difference between the internal pressure and the external pressure reaches or has exceeded the pressure threshold value, the flexible sealing lip 120 adopts the open position. The pressure threshold value may be, for example, a value within a range such as for example 0.4 bar to 1.2 bar.

Figure 2:
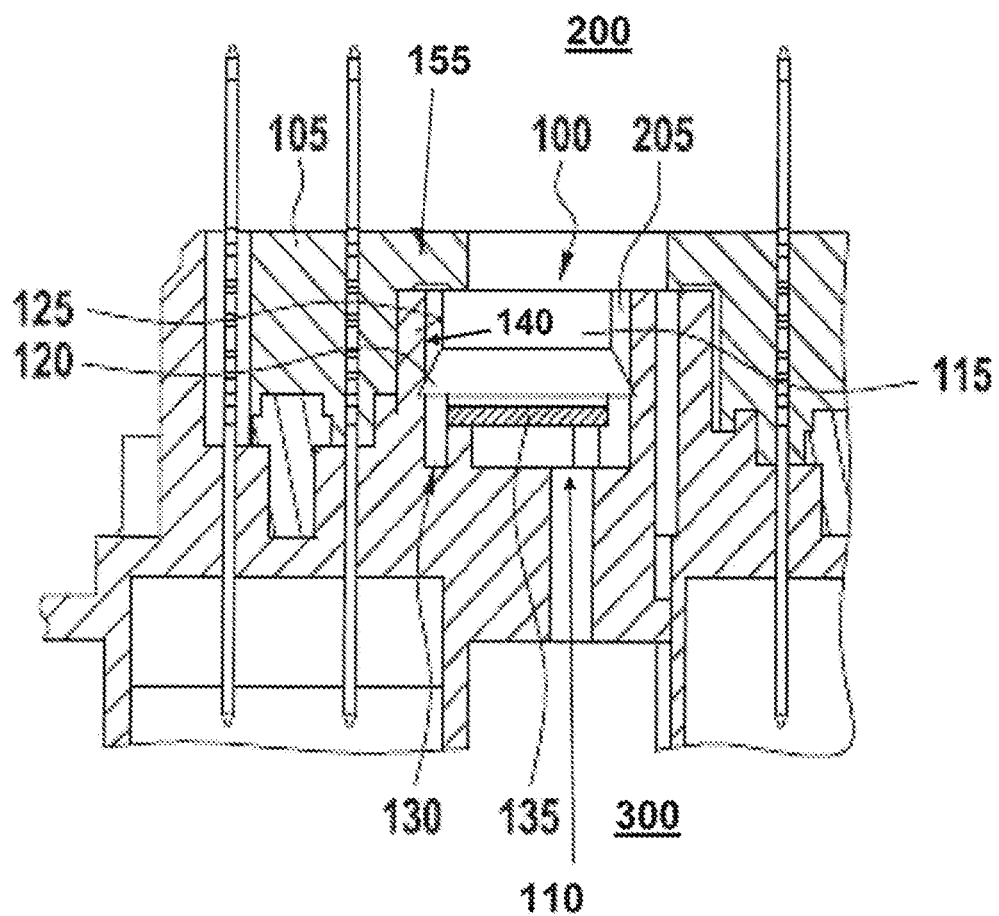
FIG. 2 shows a schematic cross-sectional view of the housing of FIG. 1.
Figure 3:
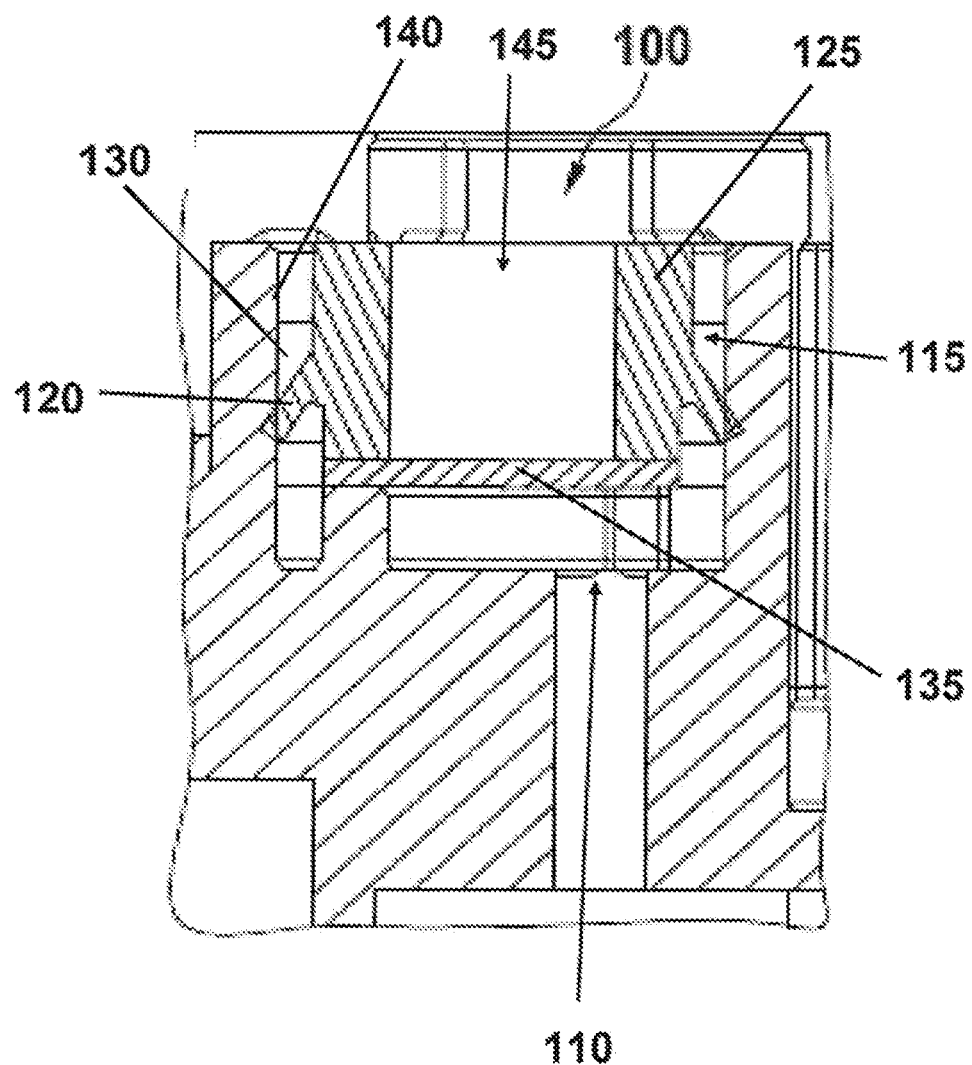
FIG. 3 shows an enlarged detail of FIG. 2.

The overpressure valve may be configured such that it permits a flow from the interior 200 into the surroundings 300 but prevents a flow from the surroundings 300 into the interior 200. As a result, with the overpressure valve an entry of moisture and dirt form the surroundings 300 into the interior 200 of the housing 105 is avoided. This is implemented here, for example, by the flexible sealing lip 120 of the lip sealing element 115 protruding away from the main part 125 at an acute angle in the direction of the surroundings 300, as FIG. 2 and FIG. 3 illustrate. Then an overpressure on the surroundings side, i.e. a higher external pressure relative to the internal pressure, ensures that the flexible sealing lip 120 is pressed more forcibly against the sealing surface 140 and the sealing action is then increased, as is easily conceivable with reference to FIG. 2 and FIG. 3.

The main part 125 of the lip sealing element 115 has an inner, for example central, gas through-channel 145 which connects the interior 200 to the surroundings 300 as required. Moreover, the pressure compensation device 100 has a gas-permeable membrane 135 which covers the inner gas through-channel 145 of the main part 125.

The borehole 205 in the housing wall of the housing 105, the lip sealing element 115, the inner gas through-channel 145 of the main part 125 and the membrane 135 in each case may have a circular cross section, wherein these elements may also be arranged coaxially.

The overpressure valve, i.e. the lip sealing element 115 interacting with the borehole 205 and the membrane 135 are arranged in a parallel connection in terms of functional technology. This means that a pressure difference between the internal pressure in the interior 200 of the housing 105 and the external pressure in the surroundings 300 of the housing 105 acts both on the overpressure valve and on the membrane 135.

The overpressure valve forms, in particular, a burst protection device for the membrane 135 such that in the event of a high internal pressure suddenly occurring in the interior 200 of the housing 105 a rapid pressure compensation is carried out into the surroundings 300, primarily by the overpressure valve and a bursting of the membrane 135 is avoided thereby. The gas-permeable membrane 135 accordingly permits a slower pressure compensation. The membrane 135 is thus gas-permeable in both directions (interior→surroundings, surroundings→interior) but may be semi-permeable relative to liquids, such that liquids may pass through the membrane 135 only in one direction, namely in this case from the interior 200 in the direction of the surroundings 300, but not in the reverse direction.

In the exemplary embodiment shown in FIGS. 1 to 3, the borehole 205 may be formed by a blind bore, wherein the base 150 of the blind bore has an axial stop for the lip sealing element 115 or for the main part 125 thereof. An eccentric opening 110 may be configured in the base 150 of the blind bore, said opening connecting to the surroundings 300 a side of the lip sealing element 115 or of the annular channel 130 and of the membrane 135 facing toward the surroundings 300. The borehole opening of the borehole 205 which may be configured as a blind bore is arranged, in particular, so as to face toward the side of the interior 200 of the housing 105 and to face away from the side of the surroundings 300. In this case, the membrane 135 is clamped, for example, between the lip sealing element 115 and the base 150 of the borehole 205 which is configured as a blind bore.

The clamping of the membrane 135 in the borehole 205 may be carried out, for example, by the lip sealing element 115 being fixed in the borehole 205 by a flow-permeable hold-down element 155. In this case, the hold-down element 155 may be formed, for example, by a cover with a through-opening, for example, so that a flow connection may be made between the interior 200 and the overpressure valve and the membrane 135. For axially fixing the lip sealing element 115 in the borehole 205, the hold-down element 155 is thus arranged in this case, for example, so as to face toward the side of the interior 200 of the housing 105 and to face away from the side of the surroundings 300.

Alternatively, the borehole 205 could also be formed, for example, by a stepped borehole, wherein a step which separates a larger borehole diameter from a smaller borehole diameter of the stepped borehole then forms, for example, an axial stop for the lip sealing element 115. The larger borehole diameter of the stepped borehole is then arranged, for example, so as to face toward the side of the interior 200 of the housing 105 and to face away from the side of the surroundings 300. Then the membrane 135 may be held or clamped, for example, between the lip sealing element 115 and the step of the stepped borehole.

The lip sealing element 115 may also be divided axially into at least two lip sealing element parts and the membrane 135 may then be axially clamped or held between the two lip sealing element parts.

According to a further embodiment, the membrane 135 may also be already vulcanized into the lip sealing element 115 during the production of the lip sealing element 115 from the elastomer material. In this case, in particular a radially outer edge of the membrane 135 may be vulcanized into the lip sealing element 115 consisting of the elastomer material.

Moreover, the membrane 135 may be unreleasably, i.e. not releasable without destruction, or releasably connected to the lip sealing element 115. For example, the membrane 135 may be connected to the lip sealing element 115 by adhesive bonding. In particular, the membrane 135 may also have a radially outer carrier ring, which is then unreleasably or releasably connected to the lip sealing element 115.

The membrane 135 may consists of at least one membrane layer. This comprises exactly one membrane layer or a plurality of membrane layers, wherein a "layer" is to be understood to mean a separate layer. Alternatively, the membrane 135 may also be formed by a composite part consisting of at least one membrane layer and at least one non-woven layer. In this case, the at least one membrane layer may consist, for example, of polytetrafluorethylene (PTFE) or of polyvinylidene fluoride (PVDF).

THE LIST OF REFERENCE NUMERALS IS AS FOLLOWS

100 Pressure compensation device
105 Housing
110 Opening
115 Lip sealing element
120 Sealing lip
125 Main part
130 Annular channel
135 Membrane
140 Sealing surface
145 Gas through-channel
150 Base
155 Cover
200 Interior
205 Borehole
300 Surroundings

The invention claimed is:

1. A housing having an interior, comprising:
   a) a pressure compensation device, which is for compensating a pressure in the interior of the housing in relation to surroundings of the housing, the interior being in connection with the pressure compensation device, and which includes at least one overpressure valve with at least one lip sealing element with a main part and at least one flexible sealing lip which protrudes radially outwardly from an outer circumference of the main part and which interacts with a sealing surface;
   b) an annular channel, between the main part and the sealing surface, wherein the at least one flexible sealing lip is in sealed contact with the sealing surface with elastic pretensioning in a sealing position and sealingly closes the annular channel to prevent a flow-conducting connection between the interior and the surroundings, and is lifted away from the sealing surface in an open position and opens the annular channel to provide a flow-conducting connection between the interior and the surroundings;
   wherein:
   c) the position of the at least one sealing lip between the sealing position and the open position is controlled as a function of a pressure difference between the pressure in the interior of the housing and the surroundings of the housing,
   d) the main part of the lip sealing element has an inner gas through-channel which connects the interior to the surroundings, as required,
   e) the pressure compensation device includes at least one gas-permeable membrane which covers the inner gas through-channel of the main part,
   f) the overpressure valve and the at least one membrane are arranged in a parallel connection, such that a pressure difference between the interior of the housing and the surroundings of the housing acts both on the overpressure valve and on the at least one membrane, having at least the following:
   g) the main part and the at least one flexible sealing lip of the lip sealing element are configured in a single piece from an elastomer material,
   h) the housing has a borehole in a housing wall which is in connection or may be brought into connection, on the one hand, with the interior and, on the other hand, with the surroundings of the housing,
   i) the lip sealing element is directly held in the borehole in the housing wall, and the sealing surface, with which the at least one flexible sealing lip interacts, is formed by the radially inner circumferential surface of the borehole in the housing wall.

2. The housing of claim 1, wherein the borehole of the housing is formed by a stepped borehole and a step of the stepped borehole forms an axial stop for the lip sealing element.

3. The housing of claim 2, wherein the at least one membrane is held or clamped between the lip sealing element and the step of the stepped borehole.

4. The housing of claim 1, wherein the borehole of the housing is formed by a blind bore, wherein the base of the blind bore forms an axial stop for the lip sealing element and at least one opening is configured in the base of the blind bore, the opening connecting to the surroundings a side of the lip sealing element and of the at least one membrane facing toward the surroundings.

5. The housing of claim 4, wherein the at least one membrane is held or clamped between the lip sealing element and the base of the blind bore.

6. The housing of claim 1, wherein the lip sealing element is fixed in the borehole by means of a flow-permeable hold-down element.

7. The housing of claim 6, wherein the at least one membrane is held or clamped between the lip sealing element and the hold-down element.

8. The housing of claim 1, wherein the lip sealing element is divided axially into at least two lip sealing element parts, and the at least one membrane is axially clamped between the two lip sealing element parts.

9. The housing of claim 1, wherein the at least one membrane is unreleasably or releasably connected to the lip sealing element.

10. The housing of claim 9, wherein the at least one membrane has a radially outer carrier ring which is unreleasably or releasably connected to the lip sealing element.

11. The housing of claim 9, wherein at least one radially outer edge of the at least one membrane is vulcanized into the lip sealing element including the elastomer material.

12. The housing of claim 9, wherein the at least one membrane is connected to the lip sealing element by adhesive bonding.

13. The housing of claim 1, wherein the at least one membrane includes at least one membrane layer or is formed by a composite part including at least one membrane layer and at least one non-woven layer.

14. The housing of claim 13, wherein the at least one membrane layer includes polytetrafluorethylene (PTFE) or of polyvinylidene fluoride (PVDF).

15. The housing of claim 1, wherein the at least one flexible sealing lip of the lip sealing element is configured over the circumference on the main part.

16. The housing of claim 1, wherein the overpressure valve is configured to permit a flow from the interior into the surroundings but prevents a flow from the surroundings into the interior.

17. The housing of claim 16, wherein the at least one flexible sealing lip of the lip sealing element protrudes away from the main part at an acute angle in the direction of the surroundings.

18. The housing of claim 1, wherein the housing is for an electronic or electro-pneumatic device of a vehicle.

* * * * *